United States Patent [19]

Uehara

[11] Patent Number: 4,951,258
[45] Date of Patent: Aug. 21, 1990

[54] DYNAMIC RANDOM ACCESS MEMORY SYSTEM INCLUDING PREDECODER MEANS

[75] Inventor: Hidenori Uehara, Tokyo, Japan

[73] Assignee: Oki Electric Industry Co., Ltd., Tokyo, Japan

[21] Appl. No.: 375,685

[22] Filed: Jul. 5, 1989

[30] Foreign Application Priority Data

Jul. 7, 1988 [JP] Japan .................. 63-169866

[51] Int. Cl.[5] .............................................. G11C 7/00
[52] U.S. Cl. ................................. 365/222; 365/230.08; 365/226
[58] Field of Search ............... 365/222, 230.06, 230.02, 365/230.08; 307/463

[56] References Cited

U.S. PATENT DOCUMENTS

| | | | |
|---|---|---|---|
| 4,194,130 | 3/1980 | Moench | 365/230.06 |
| 4,488,063 | 12/1984 | Lee | 307/463 |
| 4,494,222 | 1/1985 | White et al. | 365/230.02 |
| 4,564,926 | 1/1986 | Nikaiko et al. | 365/230.02 |
| 4,628,482 | 12/1986 | Tachiuchi et al. | 365/222 |
| 4,677,592 | 6/1987 | Sakurai et al. | 365/222 |
| 4,680,737 | 7/1987 | Oishi et al. | 365/222 |
| 4,783,768 | 12/1988 | Tanimura | 365/230.08 |
| 4,787,067 | 11/1988 | Takemae et al. | 365/230.08 |
| 4,809,233 | 2/1989 | Takemae | 365/222 X |
| 4,870,620 | 9/1989 | Yamagata et al. | 365/230.08 |

Primary Examiner—Stuart N. Hecker
Assistant Examiner—Michael A. Whitfield
Attorney, Agent, or Firm—Spencer & Frank

[57] ABSTRACT

A dynamic random access memory system comprising a memory cell matrix, a row address decoder connected to the memory matrix and a counter for producing internal address signals to refresh the cells of the memory cell matrix. A row address buffer converts the external address signals to row address signals in response to an address buffer enabling signal, and a switching circuit connected to the counter and the row address buffer is selectively switching between the counter and the row address buffer in response to an address switching signal. A decoder circuit connected to the output of the switching circuit decodes selected address signals and provides decoded address signals to the row address decoder. A first control circuit connected to the row address buffer provides the address buffer enabling signal to the row address buffer in response to a row address strobe signal, and a second control circuit provides the address switching signal to the switching circuit in response to the row address strobe signal and a column address strobe signal.

3 Claims, 7 Drawing Sheets

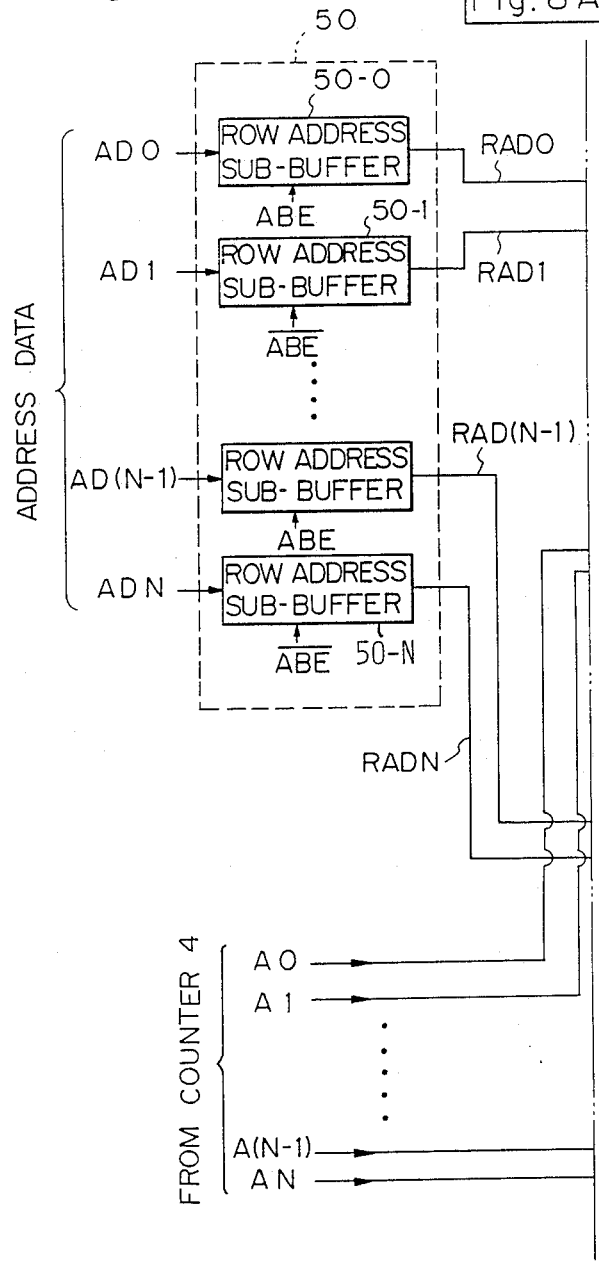

DYNAMIC RANDOM ACCESS MEMORY SYSTEM INCLUDING PREDECODER MEANS

BACKGROUND OF THE INVENTION

1. Field of the Invention

This invention relates to a dynamic random access memory (hereinafter referred to as a DRAM) system, and more particularly to an on-chip DRAM system incorporating a pre-decoder means.

2. Description of the Prior Art

Conventional DRAM systems have a memory refreshing function in which memory cells are refreshed in response to address signals (Data) which are internally generated on the DRAM chip. The internal address signal is generated when an inverted row address strobe ($\overline{RAS}$) signal changes from a high level to a low level after an inverted column address strobe ($\overline{CAS}$) signal goes, for example, from a high level to a low level. The DRAM system also includes a row pre-decoder which switches an external address signal and an internal address signal to the row address decoder.

A prior art DRAM system, for example, includes a row address buffer 5 as shown in FIG. 5. The row address buffer 5 includes a switching means 11 which receives external address signals AD0 to ADN when an address switching signal CBR, which is output from a CBR control signal is at a low level, and receives internal address signals A0 to AN when the CBR signal is at a high level. A buffer circuit 12 is connected to the output of the switching means 11, and is activated by an address buffer enabling signal ABE of a high level to output row address signals RA0 to RAN to a row pre-decoder 7.

In the CBR refreshing operation, the buffer circuit 12 is activated by a high level signal ABE after switching of the switching means 11 has been completed, since the buffer circuit 12 may be erroneously operated when either the external address state or internal address state is undecided. Hence, the CBR control circuit is designed so as to operate at such a speed that its switching signal CBR is output before the buffer circuit 12 is activated, as shown in FIG. 7.

However, the prior art DRAM system has the following disadvantages. In FIG. 7, when the address switching signal CBR is at the TTL level, and both the column and row address strobe signal CAS and RAS respectively are in a stand-by state, a current I (for example, 300 uA) flows through NMOS transistors in a NAND gate, thus consuming electic power. Also, the conventional CBR control circuit requires large MOS transistors for an AND gate to output a high level signal CBR faster than the ABE signal as shown in FIG. 7. This results in an increase in power consumption in the stand-by condition. Shortening the interval between the CBR and ABE signals to decrease power consumption in the stand-by condition may cause erroneous operation. For these reasons, it has been difficult to obtain an improved DRAM system which can achieve less power consumption in the stand-by state.

SUMMARY OF THE INVENTION

In view of the drawbacks of the conventional DRAM system, it is an object of the present invention to provide a DRAM system having reduced power consumption during the stand-by state.

It is another object of the present invention to provide a DRAM system wherein the power consumption of a CBR control circuit is reduced without decreasing the memory access speed.

It is still another object of the present invention to provide a DRAM system which operates at a refreshing speed.

To achieve the above objects, a DRAM system according to the present invention comprises a first control circuit for providing an address buffer enabling signal initiated by a row address strobe signal, a second control circuit for providing an address switching signal initiated by a column address signal, a row pre-decoder for providing a row decoded address signal, and a row address decoder for interpreting the row decoded address signal to select a row direction of the memory cell matrix, wherein the improvement comprises a row address buffer having a circuit configuration which is activated by the address buffer enabling signal after the external address signal is input, and then provides an external row address signal after a predetermined period of time. Also the row pre-decoder has a switching means for selectively receiving either the external row address signal or the internal address signal in response to the address switching signal, and a decoding circuit for interpreting a signal input from the switching means to output a row decoded address signal.

BRIEF DESCRIPTION OF THE DRAWINGS

In the accompanying drawings:

FIGS. 8A and 8B depict another embodiment of the row pre-decoder of FIG. 1.

DESCRIPTION OF THE PREFERRED EMBODIMENTS

Figure 1:
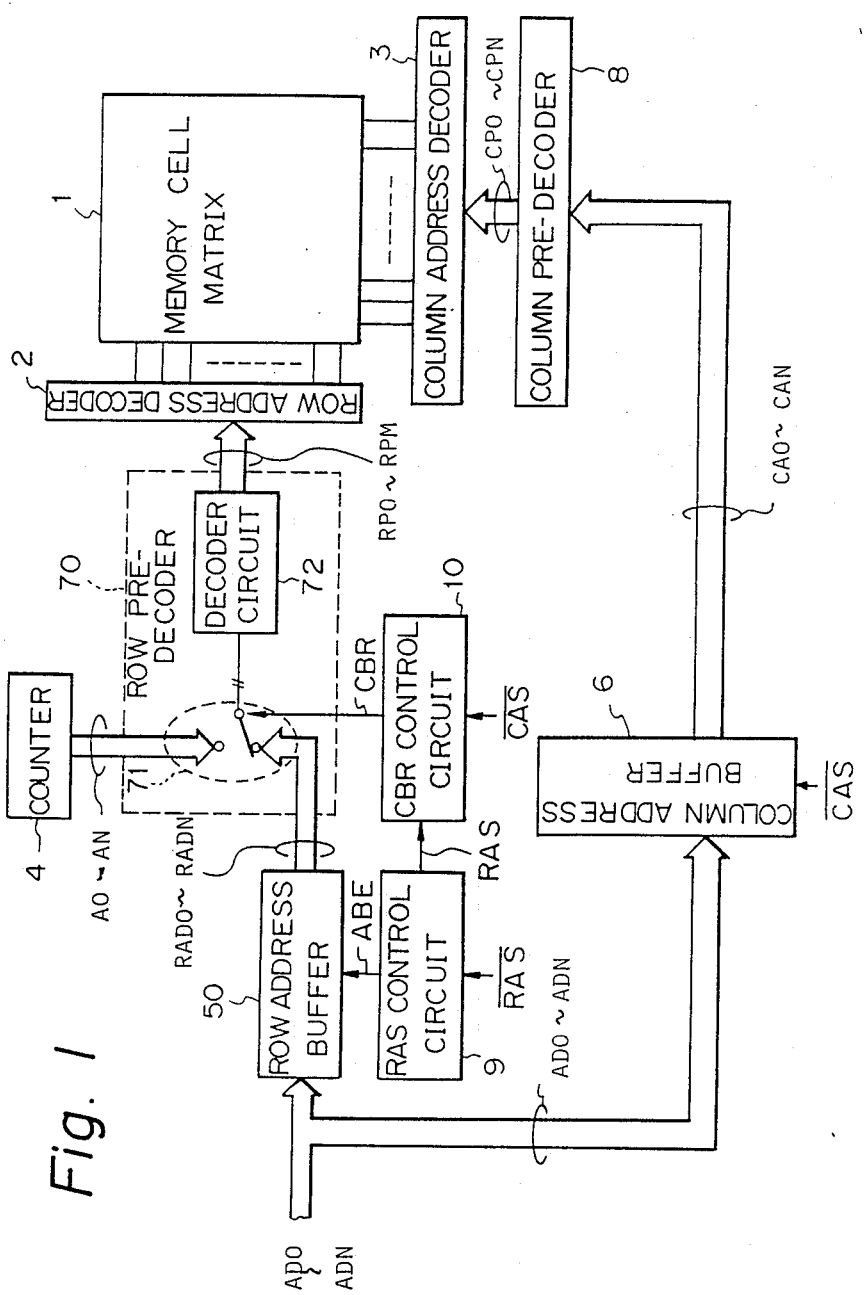
FIG. 1 is a block diagram showing an embodiment of a dynamic memory system according to the present invention.

Referring now to FIG. 1, an embodiment of a DRAM system of the present invention is illustrated. In FIG. 1, the DRAM system includes a memory cell matrix 1 having a plurality of memory cells and a plurality of sense amplifiers. The memory matrix 1 is connected to a row address decoder 2 for selecting a row, to a column address decoder 3 for selecting a column, and to input/output circuits (not shown).

The DRAM system also includes a counter 4 for producing internal address signals A0 to An for CBR refreshing, a row address buffer 50, and a column address buffer 6. The row address buffer 50 is connected to a row pre-decoder 70, while a column address buffer 6 is connected to the column address decoder 3 through a column pre-decoder 8. The row address buffer 50 is connected to a row address strobe (RAS) control circuit 9.

The RAS control circuit 9 produces both an address buffer enable signal ABE and a row address strobe signal RAS in response to an inverted row address strobe signal $\overline{RAS}$. A CBR control circuit 10 produces an address switching signal CBR in response to an inverted column address strobe signal $\overline{CAS}$ and inverted row address strobe signal $\overline{RAS}$.

The row address buffer 50 is activated by the signal ABE, and receives external address signals AD0 to ADN to produce row address signals RAD0 to RADN. The pre-decoder 70 interprets row address signals RAD0 to RADN and then produces a row pre-decode address signal RP0 to RPM to the row address decoder 2.

The column address buffer 6 captures row address signals AD0 to ADN from external address signals AD0 to ADN in response to a signal $\overline{CAS}$. The column pre-decoder 8 interprets column address signals CA0 to CAN and then produces a column pre-decoding address signal CP0 to CPN to the column address decoder 3.

Figure 3:
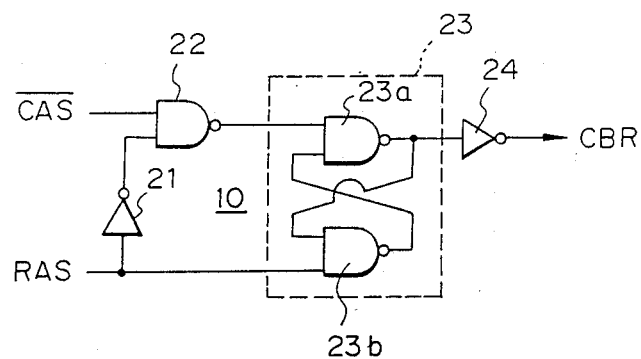
FIG. 3 is a logic diagram showing the CBR control circuit of FIG. 1.
Figure 5:
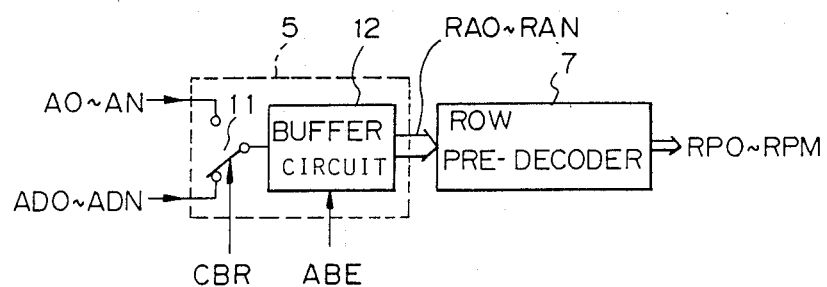
FIG. 5 is a block diagram of a row address buffer used in a prior art dynamic memory system.

FIG. 3 shows an example of the CBR control circuit 10 of FIG. 1. The CBR control circuit 10 is formed of an inverter 21 for inverting an MOS level signal RAS, and a NAND gate 22 for performing a negative logical product operation betwen a TTL (transistor transistor logic) level signal $\overline{CAS}$ and the output signal of the inverter 21. A set-reset type flip flop 23 formed of two NAND gates 23a and 23b has an input connected to the NAND gate 22 and an output connected to an inverter 24 for producing the CBR signal.

Figure 6:
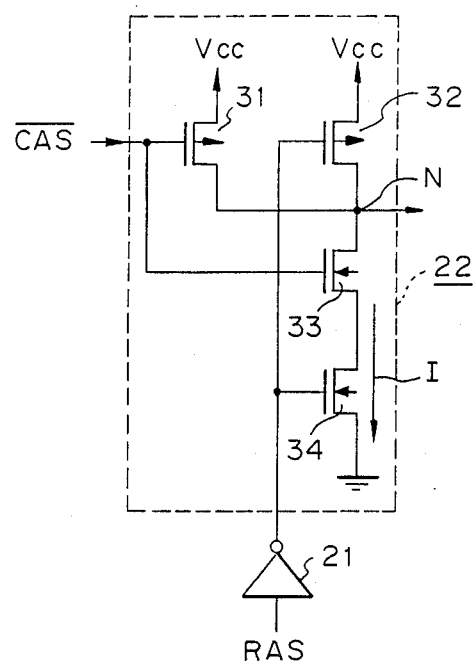
FIG. 6 is a diagram of the NAND circuit shown in the CBR control circuit of FIG. 3.
Figure 7:
FIG. 7 illustrates signal characteristics of the CBR control circuit when used with the prior art row address buffer of FIG. 5.

FIG. 6 shows an example of the NAND gate 22 seen in FIG. 3. The NAND gate 22 comprises two P-type MOS transistors 31 and 32, and two N-type MOS transistors 33 and 34. The $\overline{CAS}$ signal is input to each of the gates of the MOS transistors 31 and 33. The inverter 21 has an output connected to the gates of both the MOS transistors 32 and 34. The MOS transistors 31 and 32 are connected in parallel to each other between the power source Vcc and a node N, and the MOS transistors 33 and 34 are serially connected between the node N and ground potential. When the $\overline{CAS}$ signal and the output of the inverter 21 are at a high level, the P-type MOS transistors 31 and 32 are off, while the N-type MOS transistors 33 and 34 are on. As a result, the output node N is at a low level. When the $\overline{CAS}$ signal and the output of the inverter 21 are high and low, respectively, or both are low, the output node N is at a high level.

In FIG. 1, the row address buffer 50 receives external address signals AD0 to ADN, and produces external address signals RAD0 to RADN after a predetermined period of time when it is activated by a high level buffer enable signal ABE which is output from the RAS control circuit 9. The row pre-decoder 70 comprises a switching circuit 71 and a decoder circuit 72.

Figure 2:
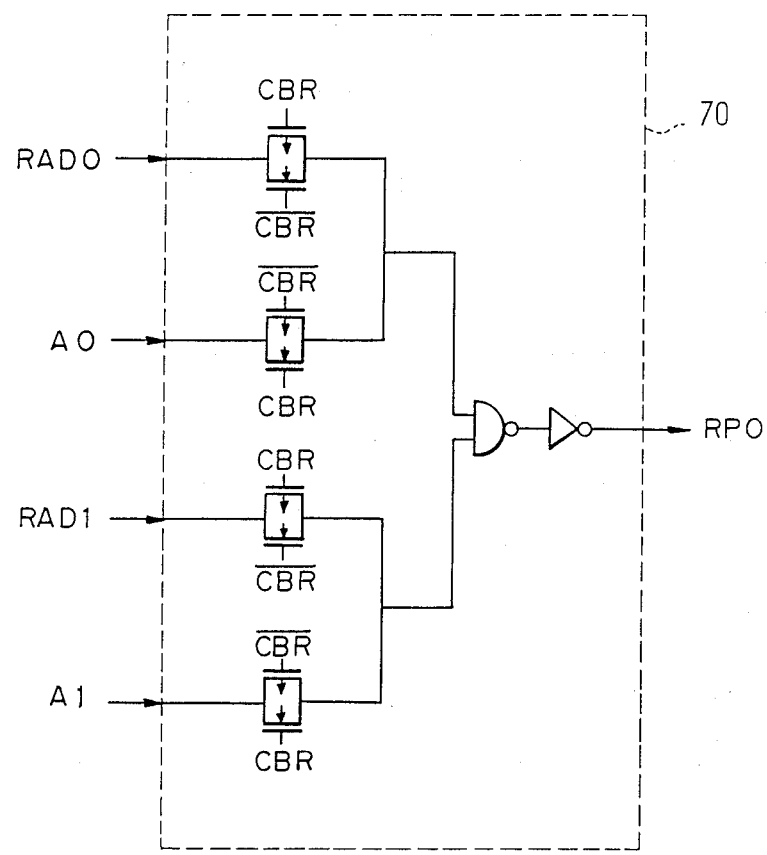
FIG. 2 is a circuit diagram showing a switching circuit of FIG. 1.

The switching circuit 71 selectively switches either the external address signals RAD0 to RADN or the internal address signals A0 to AN from the counter 4 in response to an address switching signal CBR from the CBR control circuit 10. The switching circuit 71 is formed of, for example, MOS transfer gates, a NAND gate and an inverter, as shown in FIG. 2.

The decoder circuit 72 interprets the signals from the switching means 71, and then produces row pre-decoder address signals RP0 to RPM to provide them to the row address decoder 2. The decoder circuit 72 constitutes NAND gates, NOR gates and the like.

Figure 4:
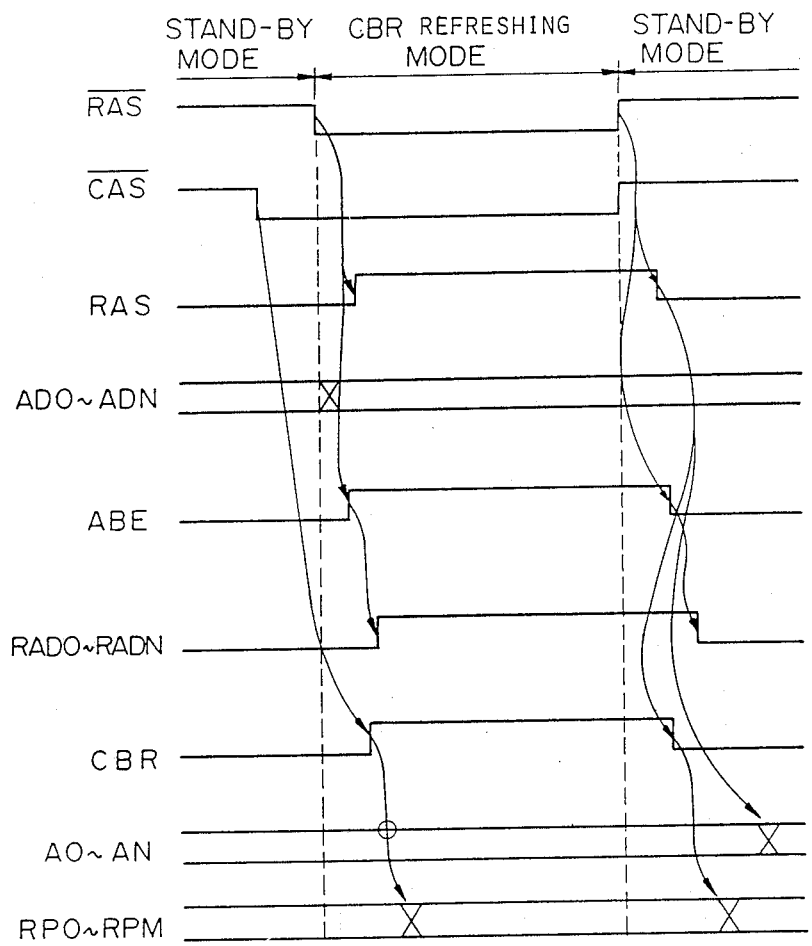
FIG. 4 shows timing charts at various modes of the dynamic memory system of FIG. 1.

FIG. 4 is a time chart showing the operation of the DRAM system according to the present invention.

With reference to FIG. 4, the CBR refreshing operation is explained as follows:

In the stand-by mode in which both the inverted row adress strobe signal $\overline{RAS}$ and the inverted column address strobe signal $\overline{CAS}$ are at a high level, the row address buffer 50 is in an inactive state since the address buffer enable signal ABE and the row addres strobe signal RAS are at a low level when output from the RAS control circuit 9.

As shown in FIG. 3, the CBR control circuit 10 produces an address switching signal CBR at a low level since the output of the NAND gate 22 is at a low level and the output of the flip-flop circuit 23 is at a low level. When the CBR signal is at a low level, the switching means 71 is connected to the output of the row address buffer 50.

When the column address strobe signal $\overline{CAS}$ falls from a high level to low level, the switching means is switched to the counter 4 since the NAND gate 22 outputs a high level signal and the flip-flop circuit 23 outputs a low level signal during the refreshing mode.

In the CBR refreshing mode, the inverted row address strobe signal $\overline{RAS}$ falls from a high level to a low level, the address buffer enable signal ABE from the RAS control circuit 9 rises to a high level, and then the row address strobe signal RAS rises to a high level. The row address buffer 50 is activated a high level signal ABE after external address signals AD0 to ADN are input, and produces internal row address signals RAD0 to RADN after a predetermined period of time.

The switching means 71 is switched to the output of the counter 4 before the row address signals are received by the row pre-decoder circuit 70. The decoder 72 decodes the internal address signals A0 to AN from the counter 4, and produces the pre-decode address signals RP0 to RPM to the row address decoder 2. Then, the row address decoder 2 interprets the row pre-decoder address signals RP0 to RPM to select a row of the memory matrix 1, thus sequentially refreshing the memory cells.

In the stand-by mode, when the inverted row address strobe signal $\overline{RAS}$ and the inverted column address strobe signal $\overline{CAS}$ rise from a low level to a high level, the row address strobe signal RAS and the address buffer enable signal ABE from the RAS control circuit 9, as seen in FIG. 4, fall from a high level to an low level. As a result, the row address buffer 50 becomes inactive, and the switching means 71 is switched to the output of the row address buffer 50 of FIG. 1 in response to a low level address switching signal CBR, whereby the CBR refreshing operation is completed.

The DRAM system explained above has the following advantages.

In the CBR refreshing operation, the external address signals AD0 to ADN and the internal address signals A0 to AN are switched with the switching circuit 71 in the row pre-decoder 70. Since the row pre-decoder 70 receives the address switching signal CBR immediately before the internal address signals A0 to AN are input, it is unnecessary to operate the NAND gate at the input stage of the CBR control circuit 10 at high speed. Therefore the MOS transistors consisting of the NAND gate 22 can be reduced in size and the power consumption of the CBR control circuit during stand-by state decreased.

Figure 8B:
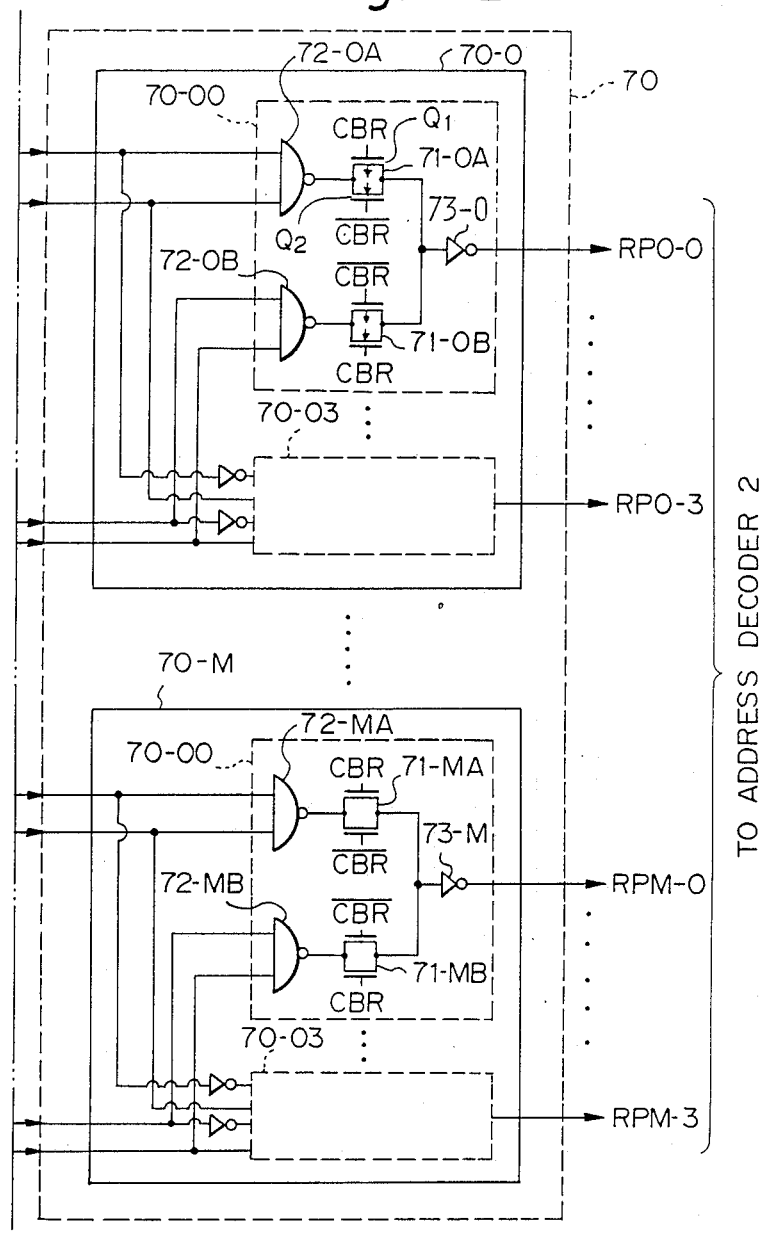

FIGS. 8A and 8B show a circuit diagram of another embodiment of the row pre-decoder according to the present invention. In FIG. 8, the same elements as those in FIG. 1 are provided with the same numerals.

A row address buffer 50 comprises a plurality of row address sub-buffers 50-0 to 50-N. The plurality of row address sub-buffers 50-0 to 50-N are respectively connected to row pre-decoders 70-0 to 70-M (where 2(N+1)=(M+1)). A main row pre-decoder 70 includes a plurality of pre-decoders 70-0 to 70-M. The pre-decoder 70-0 comprises a plurality of row output circuits 70-00 to 70-03. The row output cicuit 70-00, for example, includes NAND gates 72-0A and 72-0B, transfer gates 71-0A and 71-0B and an inverter 73-0 for producing row pre-decode address signals RPD-0 to RPD-3. The NAND gate 72-0A interprets external row address signals RAD0 and RAD1 from the row address buffers 50-0 and 50-1 to produce an external row pre-decode address signal. The NAND gate 72-0B interprets internal address signals A0 and A1 from the counter 4 to produce an internal pre-decode address signal.

The transfer gate 71-0A comprises a P-type MOS transistor Q1 and an N-type MOS transistor Q2 connected in parallel to each other. The P-type MOS transistor Q1 switches on or off by operation of an address switching signal CBR, and the N-type MOS transistor Q2 switches on or off by operation of inverted switching signal $\overline{CBR}$. The transfer gate 71-0B comprises P-type and N-type MOS transistors connected to each other in parallel. The P-type MOS transistor switches on or off by operation of the inverted signal $\overline{CBR}$ and the N-type MOS transistor switches on or off by operation of the signal CBR. In the same manner, pre-decoder 70-m comprises NAND gates 72-MA and 72-MB, transfer gates 71-MA and 71-MB, and an inverter 73-M.

When the signal CBR is at a high level and the inverted signal $\overline{CBR}$ is at a low level, the transfer gates 71-0A to 71-MA become off, while the transfer gates 71-0B to 71-MB become on. The internal pre-decode address signal which is output from the NAND gates 72-0B to 72-MB is transmitted to the inverters 73-0 to 73-M by way of the transfer gates 71-0B to 71-MB. The inverters 73-0 to 73-M produce the inverted address signals as row decode address signals RP0 to RPM, respectively to provide them to the row address decoder 2 shown in FIG. 1.

When the signal CBR is at a low level and the signal $\overline{CBR}$ is at a high level, the transfer gates 71-0A to 71-MA turn on, while the transfer gates 71-0B to 71-MB turn off. The NAND gates 72-0A to 72-MA provide the external pre-decode address signals to the inverters 73-0 to 73-M. The inverters 73-0 to 73-M output the inverted signals as row pre-decode address signals.

In the first embodiment of the row pre-decoder 70, the switching means 71 selects external address signals RAD0 to RADN or internal address signals A0 to AN, and then the decoder 72 interprets the selected address signals. On the other hand, in the second embodiment of the row pre-decoder 70, after the external address signals RAD0 to RADN and the internal address signals A0 to AN are interpreted by the NAND gates 72-0A, 72-0B, 72-MA and 72-MB, the result are selectively output through the transfer gates 71-0A and 71-0B, 71-MA and 71-MB.

It should be noted that the present invention is not limited to the embodiments disclosed in the present application. For example, the NAND gates shown in FIGS. 8A and 8B may be substituted for by OR gates. The transfer gates 71-0A, 71-0B, 71-MA and 71-MB may be substituted for by a single MOS transistor.

As described above, the DRAM memory system according to the present invention includes a pre-decoder for switching internal address signal or an external address signal during the CBR refreshing operation. Therefore the switching operation can be securely performed even if the address switching signal is generated later than the address buffer enable signal. This advantage eliminates a the need for CBR control circuit having the input operable at high speed, and allows the use of small semiconductor devices at the input so that it is possible to decrease the power consumption during the stand-by state.

What is claimed is:

1. A dynamic random access memory system comprising:
    (a) a memory cell matrix;
    (b) a row address decoder connected to said memory matrix for selecting a specific row of said memory cell matrix;
    (c) a counter for producing internal address signals, said internal address signals being used for refreshing the cells of said memory cell matrix;
    (d) a row address buffer for receiving external address signals and converting said external address signals to row address signals in response to an address buffer enabling signal;
    (e) a switching circuit having at least first and second inputs and an output, said first input being connected to said counter and said second input being connected to said row address buffer for selectively switching said first and second inputs in response to an address switching signal;
    (f) a decoder circuit connected to the output of said switching circuit for decoding selected address signals and providing decoded address signals to said row address decoder;
    (g) a first control circuit connected to said row address buffer for providing said address buffer enabling signal to said row address buffer in response to a row address strobe signal; and
    (h) a second control circuit connected to said switching circuit for providing said address switching signal to said switching circuit in response to said row address strobe signal and a column address strobe signal, said second control circuit including,
        a NAND circuit responsive to said row address strobe signal and said column address signal; and
        a flip flop circuit for producing said address switching signal in response to the row address signal and the output of said NAND circuit;
    whereby refreshing of the cells of said memory matrix is independent of the sequence in which said address switching signal and said address buffer enabling signal are generated.

2. A dynamic random access memory system according to claim 1, wherein said system further comprises:
    (i) a column address buffer for receiving said external address signals and converting said external address signals to column address signals in response to said column address strobe signal;
    (j) a column address pre-decoder connected to said column address buffer for converting said column address signals to column address predecoding signals; and (k) a column address decoder interposed between said column address pre-decoder and said memory matrix for selecting a specific column of said memory cell matrix in response to said column address predecoding signals.

3. A dynamic random access memory system according to claim 1, wherein said NAND circuit and said flip-flop circuit are comprised of MOS-type logic circuits.

* * * * *